United States Patent [19]

Yamamoto et al.

[11] Patent Number: 4,851,881
[45] Date of Patent: Jul. 25, 1989

[54] OPTICAL PRINTING SYSTEM

[75] Inventors: Takemi Yamamoto; Koji Kobayakawa; Ichiro Sasaki; Ryohei Komiya; Akira Sago; Izumi Takagi; Jun Sakai; Yumio Matsumoto, all of Aichi, Japan

[73] Assignee: Brother Kogyo Kabushiki Kaisha, Aichi, Japan

[21] Appl. No.: 185,832

[22] Filed: Apr. 25, 1988

Related U.S. Application Data

[63] Continuation-in-part of Ser. No. 33,331, Mar. 31, 1987, Pat. No. 4,740,809, and a continuation-in-part of Ser. No. 50,313, May 14, 1987, Pat. No. 4,810,614.

[30] Foreign Application Priority Data

| Apr. 1, 1986 | [JP] | Japan | 61-76282 |
| May 19, 1986 | [JP] | Japan | 61-113877 |
| May 19, 1986 | [JP] | Japan | 61-113876 |
| May 19, 1986 | [JP] | Japan | 61-113872 |
| May 19, 1986 | [JP] | Japan | 61-113873 |
| Jul. 9, 1986 | [JP] | Japan | 61-105432 |
| Jul. 25, 1986 | [JP] | Japan | 61-175897 |
| Aug. 1, 1986 | [JP] | Japan | 61-182529 |
| Nov. 20, 1986 | [JP] | Japan | 61-277595 |

[51] Int. Cl.⁴ ............... G03B 27/32; G03B 27/52
[52] U.S. Cl. ............... 335/27; 355/100; 430/138
[58] Field of Search ............... 355/27, 100, 32; 354/297; 430/138, 211, 235, 962

[56] References Cited

U.S. PATENT DOCUMENTS

| 3,072,481 | 1/1963 | Berrnaw et al. | 430/138 |
| 3,576,660 | 4/1971 | Bayless et al. | 503/215 |
| 4,448,516 | 5/1984 | Arney et al. | 355/27 |
| 4,494,865 | 1/1985 | Andrus et al. | 355/32 |
| 4,624,560 | 11/1986 | Beery | 355/27 |
| 4,648,699 | 3/1987 | Holycross et al. | 355/27 X |
| 4,740,809 | 4/1988 | Yamamoto et al. | 355/27 |
| 4,742,374 | 5/1988 | Yamamoto et al. | 430/138 X |
| 4,748,475 | 5/1988 | Ishiyama et al. | 355/27 |
| 4,777,513 | 10/1988 | Nelson | 355/27 |
| 4,785,332 | 11/1988 | Nagumo et al. | 355/27 |

FOREIGN PATENT DOCUMENTS

WO85/00670 2/1985 PCT Int'l Appl.
2188741 10/1987 United Kingdom.

Primary Examiner—Richard A. Wintercorn
Attorney, Agent, or Firm—Kane, Dalsimer, Sullivan, Kurucz, Levy, Eisele and Richard

[57] ABSTRACT

In an optical printing system for printing an image on a recording sheet, adopted as the recording sheet is a sheet coated with microcapsules on one surface thereon. Each microcapsule envelopes a first component which changes color when reacts with a second component. The second component may be coated on the recording sheet or may be coated on a separate developing sheet. The microcapsule further envelopes a third component which varies the mechanical strength of microcapsule when light is projected thereto. An image is formed on the recording sheet by selectively exposing a light thereto in accordance with the image to be printed thereon, and the microcapsules on the recording sheet whose mechanical strength is low are then ruptured by rupturing means. Thereby, the color is developed or the recording sheet on the first component with the second component. The printing operation of the printing system is executed by control means in accordance with a predetermined sequence.

30 Claims, 21 Drawing Sheets

OPTICAL PRINTING SYSTEM

This application is a Continuation-in-Part of both Application Ser. No. 33,331, filed Mar. 31, 1987, now U.S. Pat. No. 4,780,809, issued Apr. 26, 1988, and Application Ser. No. 50,313, filed May 14, 1987, now U.S. Pat. No. 4,810,614, issued Mar. 7, 1989.

BACKGROUND OF THE INVENTION

This invention relates to an optical printing system capable of printing characters, patterns or the like by using light.

Printers utilized in computers or the like are classified into various types according to their printing systems. Use of photoprinters has been increased in recent years because of their high printing speed and low operating noise. As the apparatus of this type, those utilizing electrophotographic technique are used in most cases.

According to the electrophotographic technique, an image of a character or a pattern is formed on a charged photoconductive member by utilizing a suitable optical system, powders of colored resin called toner is adhered to the not-irradiated portion on the photoconductive member that is the portion still retaining charge, the adhered powders are transferred onto a copying paper, and then the transferred powder image is fixed to obtain a copy.

The photoprinter described above requires to use a photoconductor, a toner applying apparatus and a heat fixing device of the toner. For this reason, the construction of the apparatus bacomes complicated and the maintenance thereof is troublesome.

There has also been used a photocolor printer in which colored characters or picture images are printed on a photo and pressure sensitive sheet by photo-signals such as laser photo-signals.

A laser printer of a well known construction is illustrated in FIG. 6. As shown, the laser printer comprises a laser beam oscillator 301, a modulator 302, a polygonal scanning mirror 303, a f lens 305, a photoconductive drum 306 including a charging station 307, a toner developing station 308, a transferring station 309 and a charge removing and cleaning station 310.

A recording paper 311 is passed between the photoconductive drum 306 and a transferring device 309 and guided to a fixing device 312. In this printer, the laser beam emitted by the laser beam oscillator 301 is turned ON and OFF by the modulator 302 in accordance with character or picture image informations outputted from a control unit contained in the printer. The photo-signals thus formed are projected upon the photoconductive drum 306 through the scanning mirror 303 and the f lens 305 so as to form an electrostatic latent image on the photoconductive drum 306 corresponding to the outputted informations. Then, the toner is caused to adhere to the electrostatic latent image on the drum 306 and the resulting toner image is transferred onto the recording paper 311 and then fixed by the fixing device 312. In this prior art laser printer, character or picture images of only a single color can be recorded. An ordinary paper is used as the copying paper and the toner is caused to adhere onto the paper to print the character or the picture images. Consequently, resolution is low and the photoconductive drum and other accessories complicate the construction of the printer.

In a color printer other than the laser printer described above multicolor toners (for example, red, green and blue colors) or color ink ribbons are used to obtain a print of all colors. With such color printing system, however, as it is necessary to print the same portion of the recording paper by the times the same as the number of colors. Accordingly, the printing speed becomes low.

SUMMARY OF THE INVENTION

It is therefore an object of this invention to provide a novel optical printing system which is not necessary to use toners, has a high resolution, can record characters and picture images at a high speed, with simple construction.

Another object of this invention is to provide an optical printing system in which a photo-image transmitted through or reflected by a manuscript and a photo-image produced by character or pattern informations are selectively projected upon a photo and pressure sensitive recording sheet.

According to this invention there is provided an optical printing system for printing an image on a recording sheet, the improvement which comprises in that said recording sheet is coated with microcapsules on one surface thereof, each said microcapsule enveloping a first component which changes color when reacts with second component, said microcapsule further enveloping a third component which varies the mechanical strength of microcapsule when light is projected thereto;

that said printing is carried out by means for selectively exposing a light against said one surface of the recording sheet in accordance with an image to be printed on said recording sheet, and means for rupturing the microcapsules whose mechanical strength is low; and that said optical printing system includes control means for carrying out said printing in accordance with a predetermined sequence.

According to a modification of this invention there is provided an optical printing system for printing an image on a recording sheet, the improvement which comprises in that said recording sheet comprises a supporting sheet and a plurality of photosensitive microcapsules being uniformly coated on one surface of said supporting sheet, the mechanical strength of said photosensitive microcapsules being varied when exposed to light, said microcrocapsules comprising cyan microcapsules each containing a cyan dye precursor and a first photosensitive resin, magenta microcapsules each containing a magenta dye precursor and a second photosensitive resin, and yellow microcapsules each containing a yellow dye precursor and a third photosensitive resin, said first, second and third photosensitive resins being sensitive to lights of different wave length respectively;

that said printing is carried out by means for exposing lights of wavelength regions sensible by said respective microcapsules said one surface of the recording sheet, and means for rupturing the microcapsules whose mechanical strength is low; and that said optical printing system includes control means for carrying out said printing in accordance with a predetermined sequence.

According to still another modification, there is provided an optical printing system which employs a first exposure means and a second exposure means, and wherein select means for selecting which one of said first and second exposure means is utilized to expose the recording sheet.

BRIEF DESCRIPTION OF THE ACCOMPANYING DRAWINGS

Figure 5A:
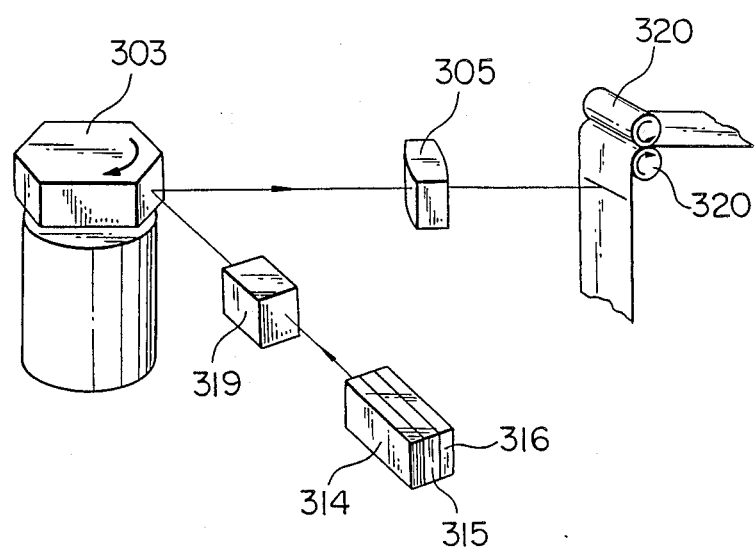
Figure 5B:
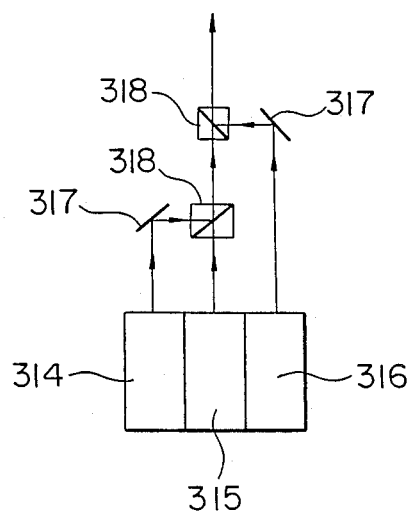
Figure 5C:
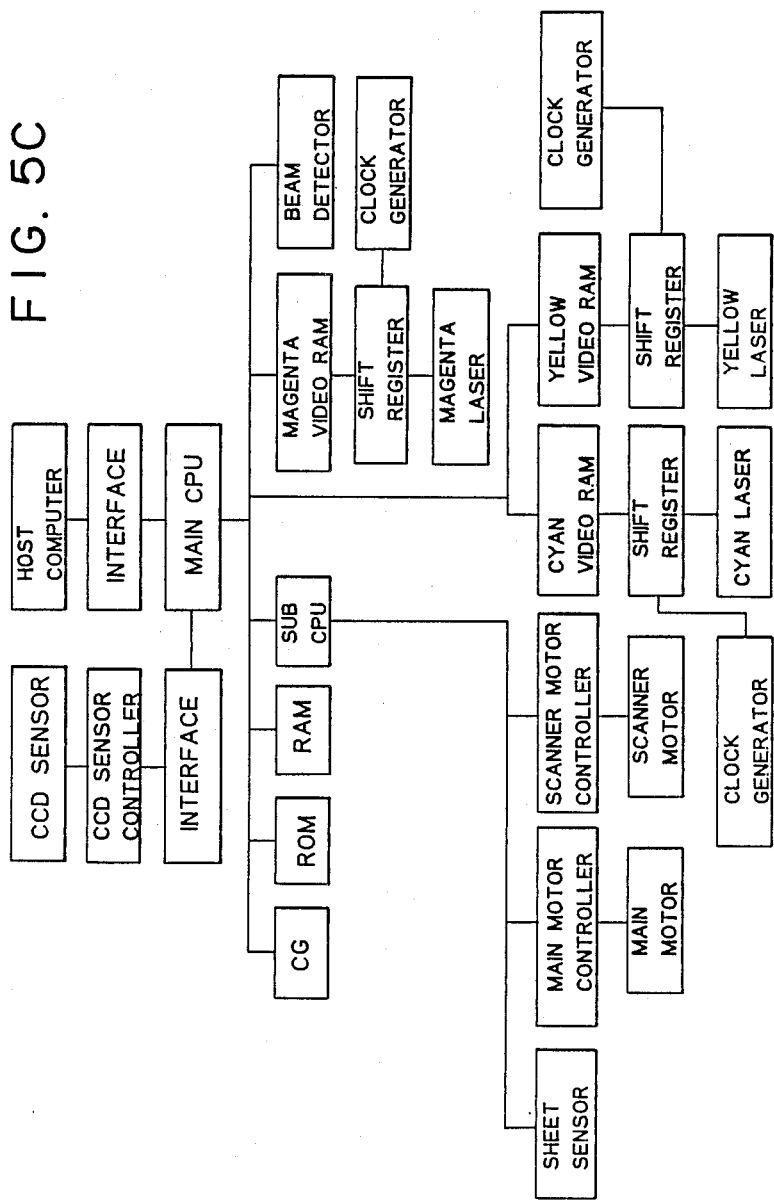
Figure 5D:
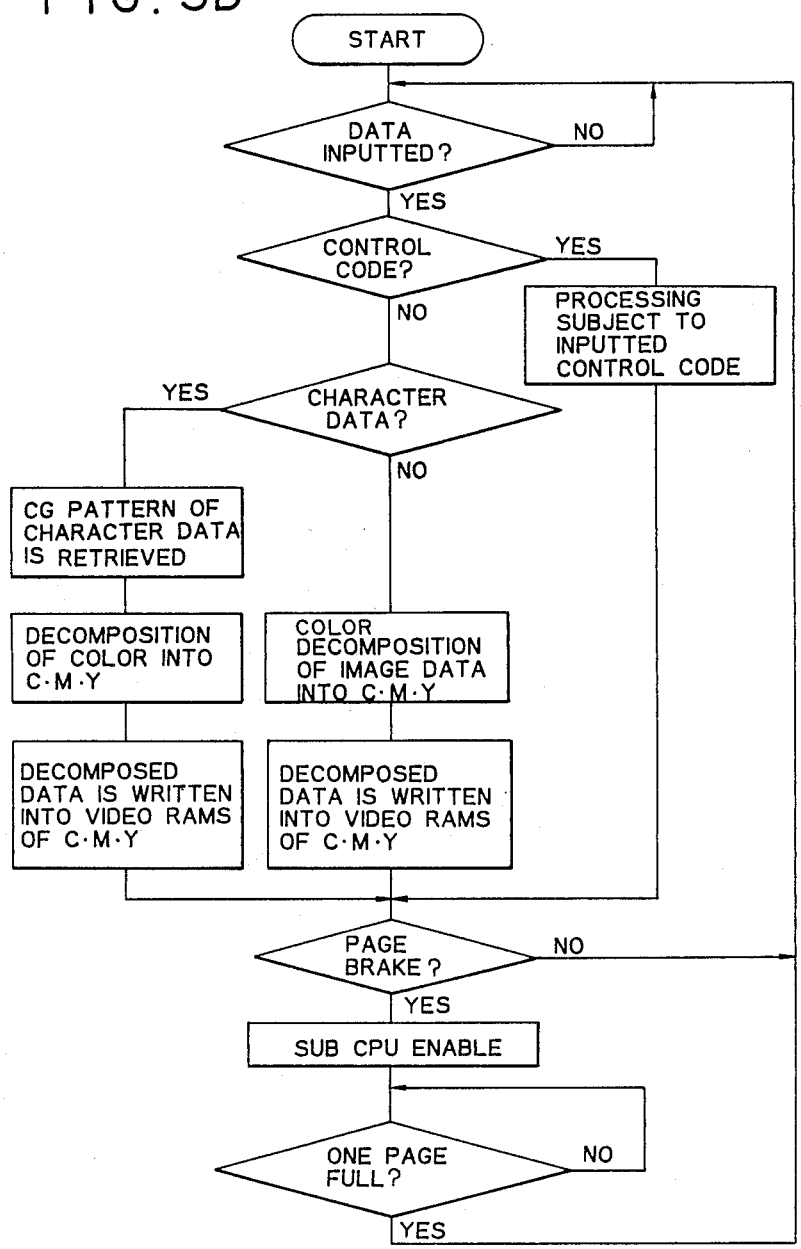
Figure 5E:
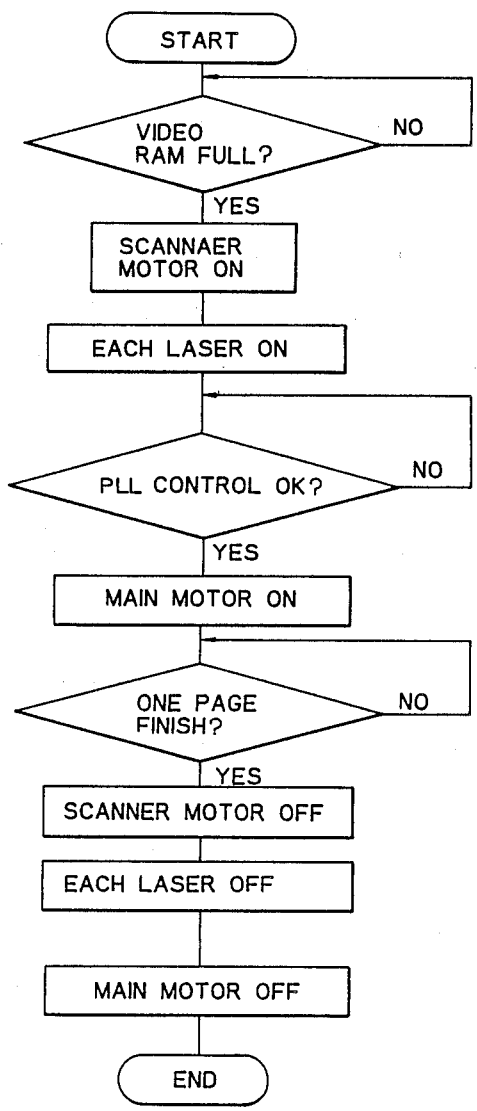
Figure 5F:
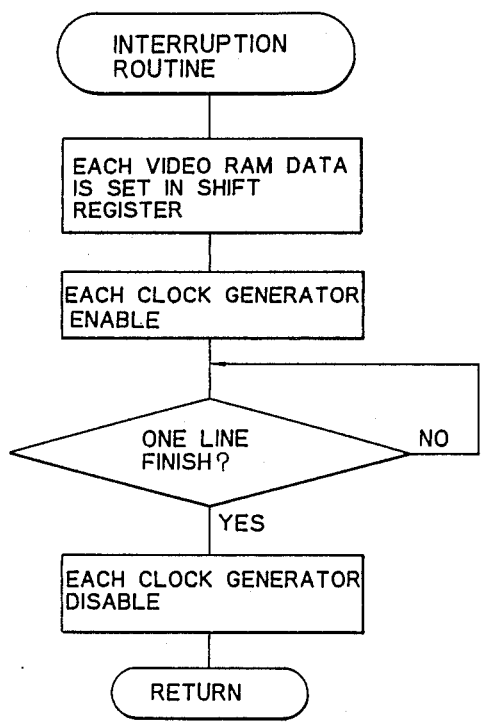
Figure 6:
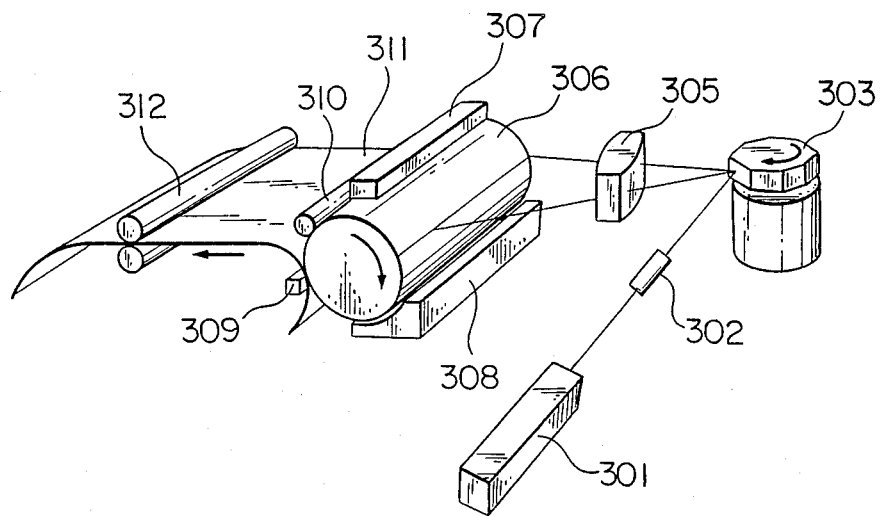
Figure 7A:
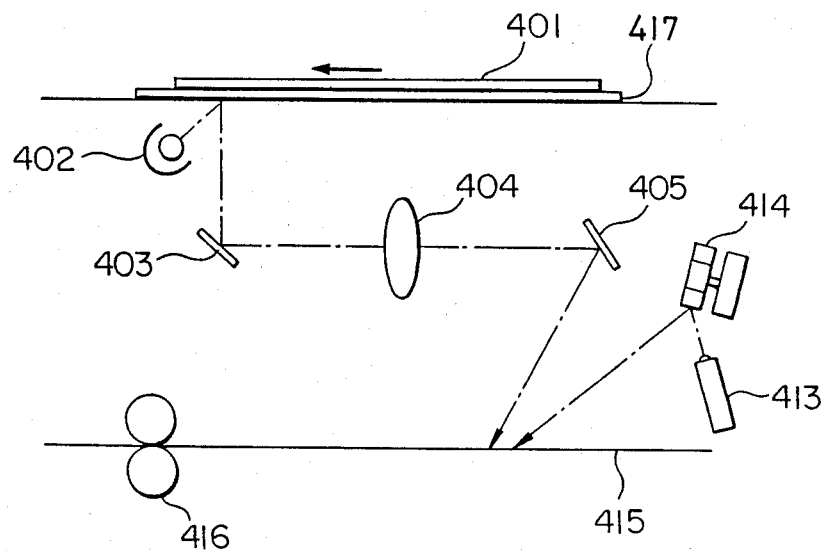
Figure 8:
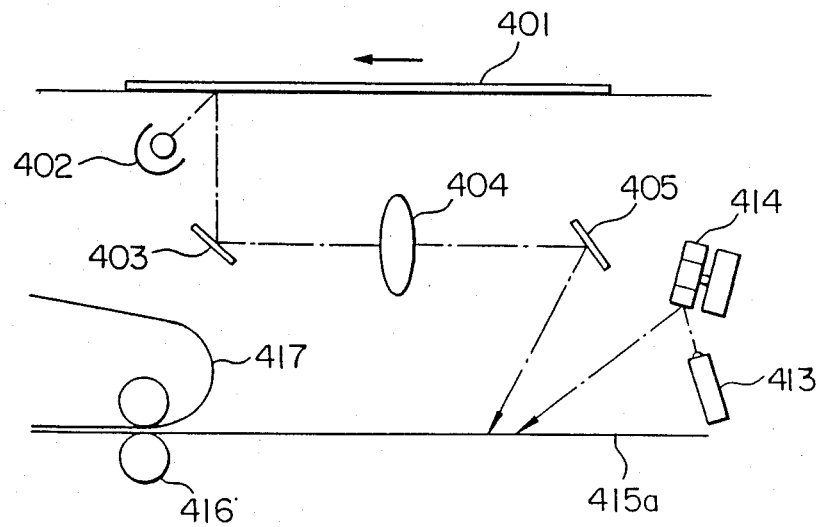
Figure 7B:
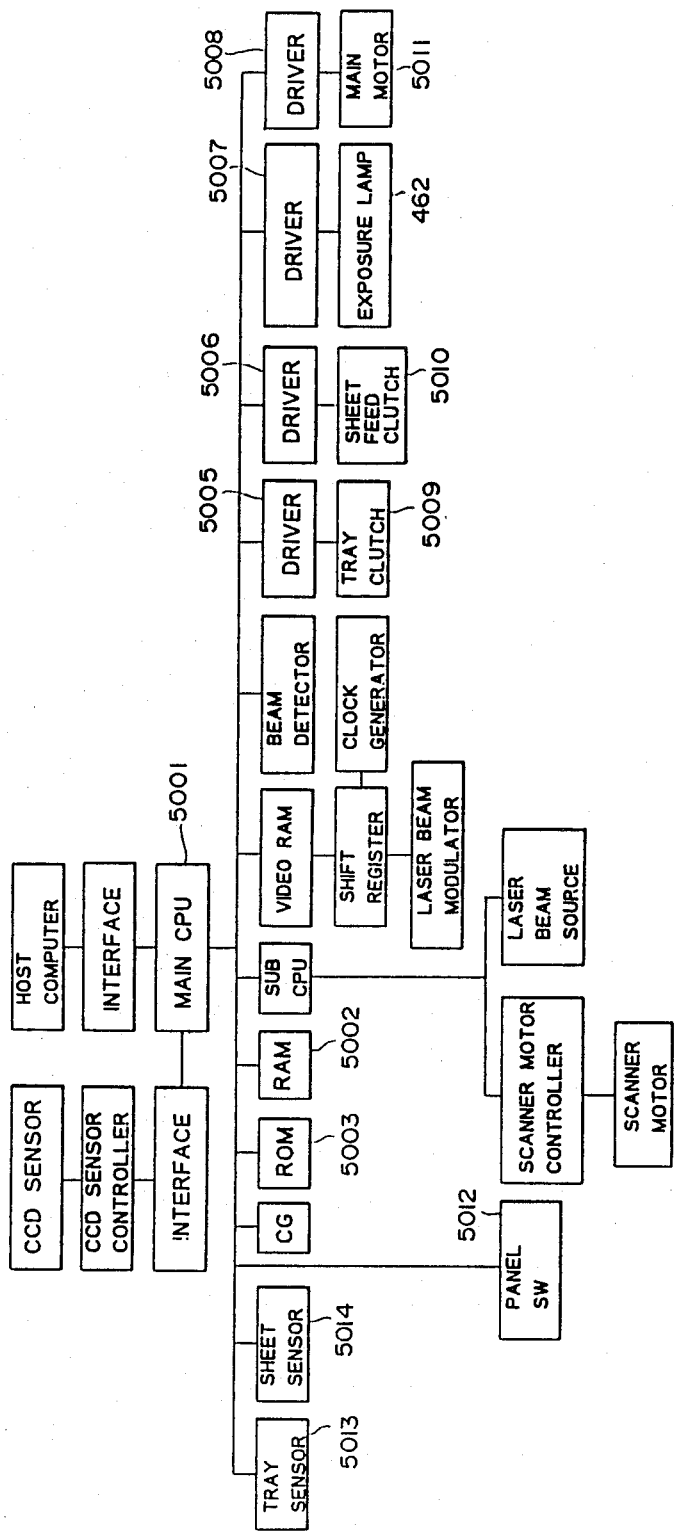
Figure 7C:
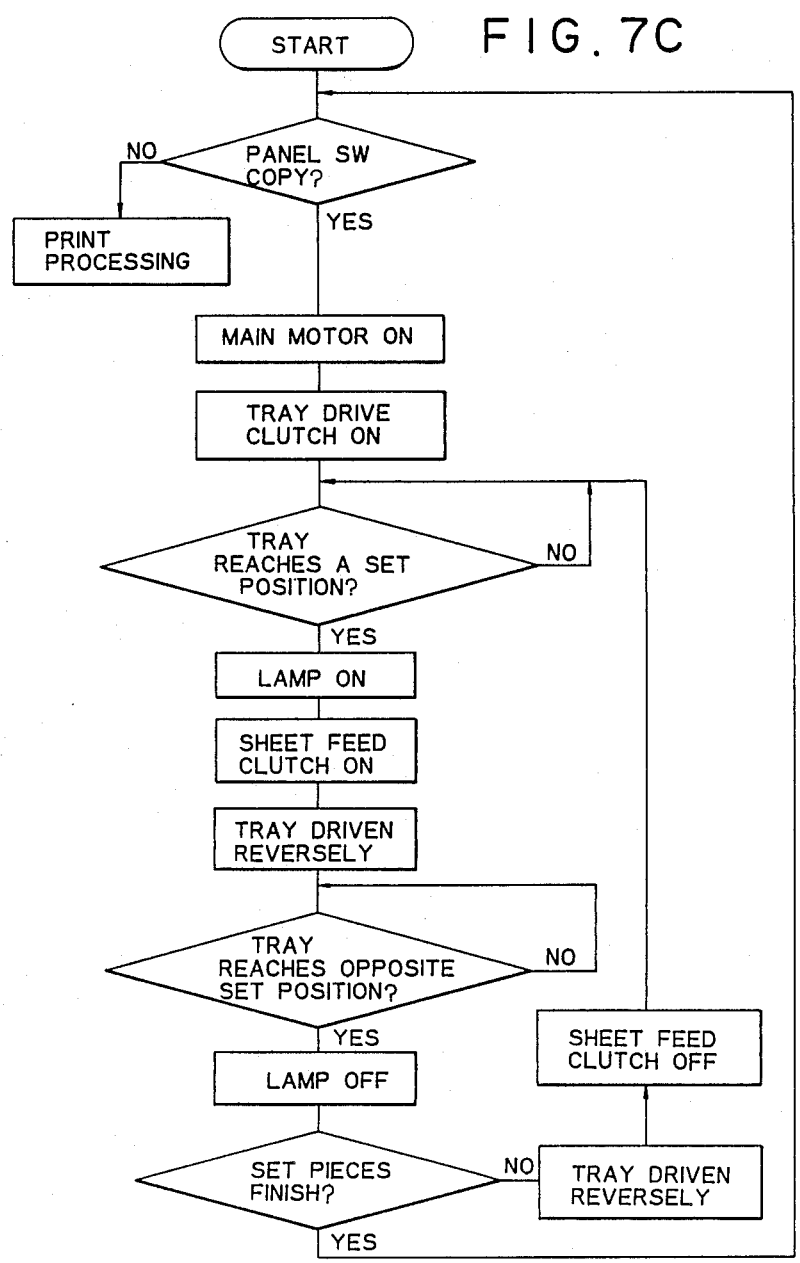

FIG. 5A. is a diagrammatic representation of the laser printer according to the invention;

FIG. 5B is a plan view showing a laser beam oscillator shown in FIG. 5A;

FIG. 5C is a block diagram showing a control unit of the laser printer illustrated in FIG. 5A;

FIG. 5D is a flow chart of a program executed by the control unit illustrated in FIG. 5C;

FIG. 5E is a flow chart of additional program executed by the control unit illustrated in FIG. 5C;

FIG. 5F is a flow chart of an interruption routine executed by the control unit illustrated in FIG. 5C;

FIG. 6 is a diagrammatic representation showing a prior art laser printer;

FIG. 7A is a diagrammatic representation showing a further modification of the invention in which an optical image transmitting through or reflected by a manuscript and an optical image produced by a character or pattern information are selectively projected upon a photo and pressure sensitive recording sheet;

FIG. 7B is a block diagram showing a control unit of the printer illustrated in FIG. 7A;

FIG. 7C is a flow chart of a program executed by the control unit illustrated in FIG. 7B; and FIG. 8 is a diagrammatic representation showing a modification of the printer illustrated in FIG. 7A.

DESCRIPTION OF THE EMBODIMENTS

Figure 1A:
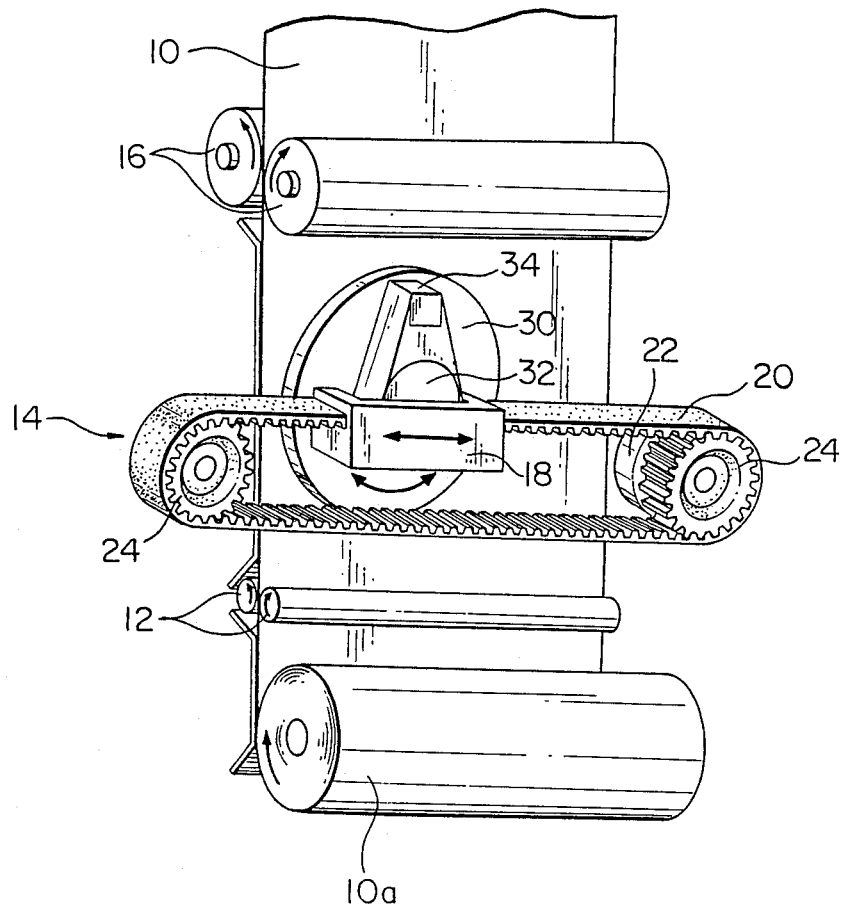
FIG. 1A is a perspective view showing principal portions of a photoprinter utilizing a transparent printing type font and embodying the invention.

FIG. 1A shows principal parts of a photoprinter utilizing a printing-type wheel 30, on the peripheral portion of which a font of type characters are formed as being transparent. The printer comprises a pair of sheet rollers 12 for upwardly feeding a photosensitive recording sheet 10 from a roll 10a, an exposing device 14 for exposing a light against the sheet 10 in accordance with a shape of a selected type character on the wheel 30, a pair of press rollers 16 for applying a pressure to the exposed sheet 10.

The exposing device 14 comprises a carriage 18, an endless belt 20 with teeth on the inner surface which supporting a carriage 18 and extending in a direction perpendicular to the direction of movement of the photosensitive recording sheet 10, and a carriage motor 22 for driving the endless belt 20 through gears 24. The carriage 18 is provided with the printing type wheel 30 disposed in parallel with the recording sheet 10, and a lamp 34 is disposed to illuminate only one transparent type character on the wheel 30.

The photoprinter shown in FIG. 1A operates as follows. In response to a printing instruction, a wheel motor 32 rotates the printing type wheel 30 and stops the same when a desired type character is brought to the position of the lamp 34. Then, it is turned on to project a light upon the photosensitive recording sheet 10 through the selected transparent type character. After that, the carriage 18 is moved to the next printing position at which the next exposure is performed. When the exposure of one line completes, the photosensitive recording sheet 10 is moved upwardly by a distance corresponding to one line. Then the carriage 18 is moved in the opposite direction for exposing the next one line.

Figure 2A:
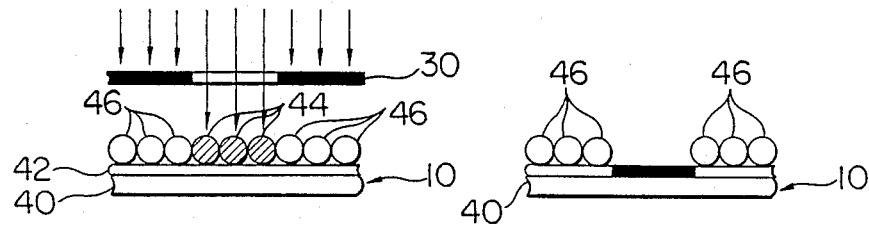
FIGS. 2A through 2D are diagrams showing the construction of a photosensitive recording sheet and explaining development and fixing treatments thereof.
Figure 2B:
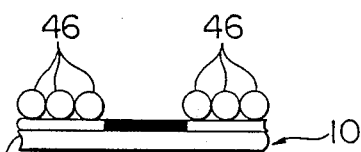

The development and fixing of the photosensitive recording sheet 10 are carried out as follows. As the photosensitive recording sheet 10 comprises, as shown in FIGS. 2A and 2B, a sheet of paper 40 used as the supporting member and microcapsules 46 uniformly laid on the paper 40. Each microcapsule contains a dye precursor (for example Triallylmethane compound) and photo-softenable resin (for example 3-oxyamino-2-butanon methacrylate). The paper sheet 40 is further coated with a layer 42 of a color developing material, for example an organic acid, which reacts with the dye precursor to develop a color. With this construction, only the microcapsules 44 irradiated with Xenon light transmitting through a selected transparent type character of the transparent printing type wheel 30 become soft, whereas microcapsules 46 not irradiated with Xenon light still maintain the initial hard state. Consequently, by the pressure applied by press rollers 16, only the softened microcapsules 44 are crushed so that only the portions of the paper sheet 10 corresponding to characters are colored. One example of such photosensitive recording sheet 10 is described in the U.S. Pat. Specification No. 4399209 or 4440846.

Figure 2C:
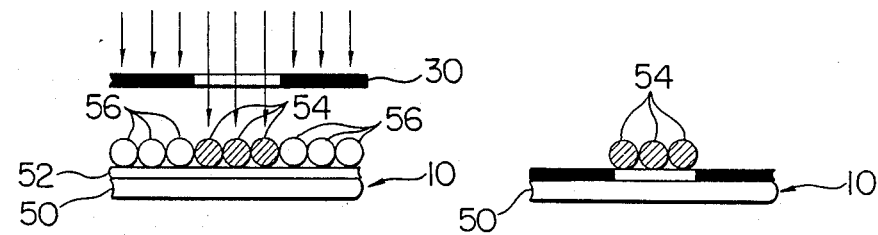
Figure 2D:
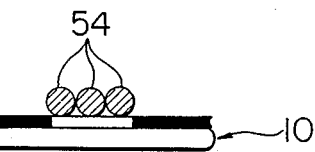

In another example shown in FIGS. 2C and 2D, a film 50 is used as the supporting member. In this example, each microcapsule contains a dye precursor, a photo-curable resin (for example such photopolymer as Torimethlpropane), and a photo-polymerizing initiator (for example Benzophenone) and a color developing material 52 is coated on the film 50. Where the microcapsules 54 on the recording sheet 10 irradiated with light are hardened as shown in FIG. 2C, whereas those not irradiated are not hardened. When applied with pressure by the press rollers 16, only the unhardened microcapsules 56 are crushed thus forming a negative image on the recording sheet 10 corresponding to the selected transparent type character of the printing type wheel 30. Hardened microcapsules 54 are not crushed so that the printed character image can be developed. The developed character image can be used to form a manuscript negative film for producing a plurality of copies.

Instead of coating a color developing material on a paper sheet or film, the paper sheet or film may be colored beforehand, and a decolorizing agent such as a bleaching agent may be enveloped in the microcapsules instead of the dye precursor. Then a positive image can be obtained.

Further, instead of the printing type wheel 30 as above described, the printing type wheel having a font of type characters formed to shield a light while the remaining portions thereof being formed to transmit a light therethrough can be used. In this case, a negative image is printed on the recording sheet.

As above described, where the photoprinter of this embodiment is used with a photosensitive recording sheet of a desired type, a positive or negative printed character image can readily be obtained. Moreover, since no photoconductor is used and no consumptive material other than the recording sheet is required, the construction of the apparatus becomes simple and supplement of the consumptive material is not necessary.

Hereinafter, a control unit for operating the above printer is explained in conjunction with FIGS. 1B and 1C.

Figure 1B:
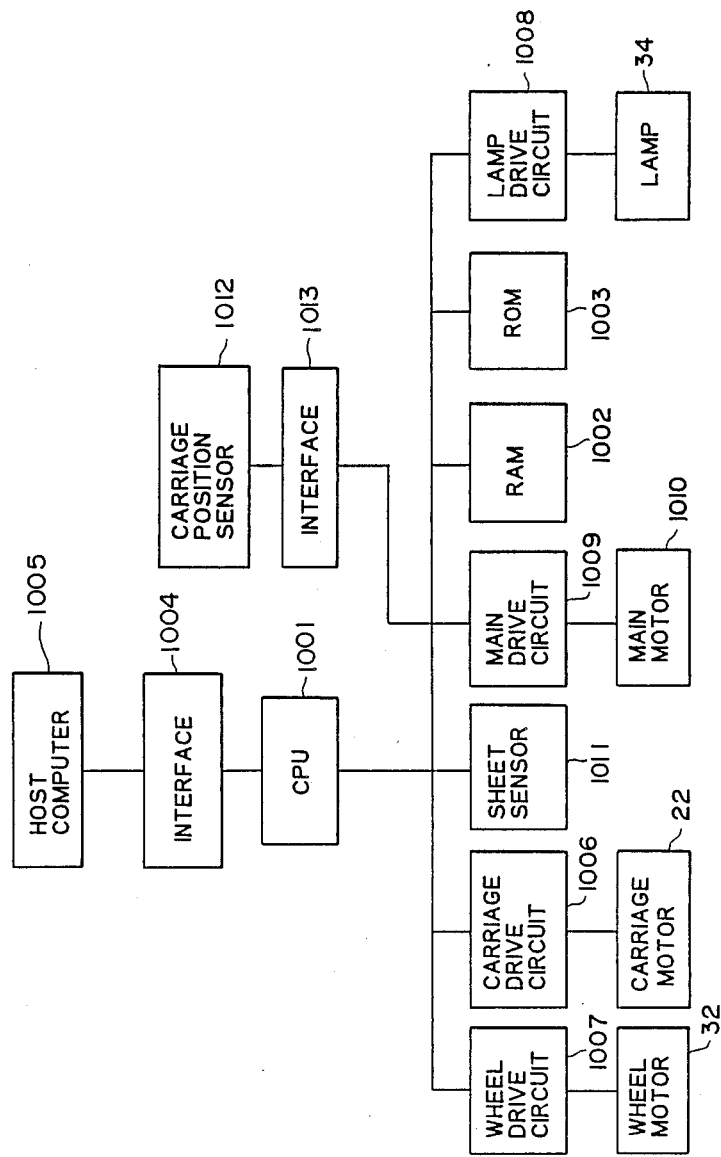
FIG. 1B is a block diagram showing a control unit of the photoprinter illustrated in FIG. 1A.

As illustrated in FIG. 1B, a control unit principally comprises a CPU (Central Processing Unit) 1001, a RAM (Random Access Memory) 1002 which serves as a data memory, a ROM (Read Only Memory) 1003 which serves as a program memory and an Interface 1004.

To the CPU 1001, character data to be recorded on the recording sheet 10 or control code data are inputted from a host computer 1005 through the Interface 1004.

In response to the inputted character data, the CPU 1001 controls the revolution of the carriage motor 22 through a carriage drive circuit 1006 while controls the revolution of the wheel motor 32 through a wheel drive circuit 1007. Further, the CPU 1001 controls the lamp 34 to be turned on and off through a lamp drive circuit 1008, and controls through a main drive circuit 1009 the revolution of a main motor 1010 which drives the press roller 16 for feeding the recording sheet 10.

A recording sheet sensor 1011 shown in FIG. 1B serves to detect the exhaustion of the recording sheet 10 wound on the roll 110a. When the recording sheet 10 is exhausted, the CPU 1001 interrupts and suspends its operation and represents the exhaustion of the sheet on, for instance, a sheet display (not shown).

A carriage sensor 1012 is provided to detect the position of the carriage 18 and the result of detection is fed to the CPU 1001 through the Interface 1004.

Figure 1C:
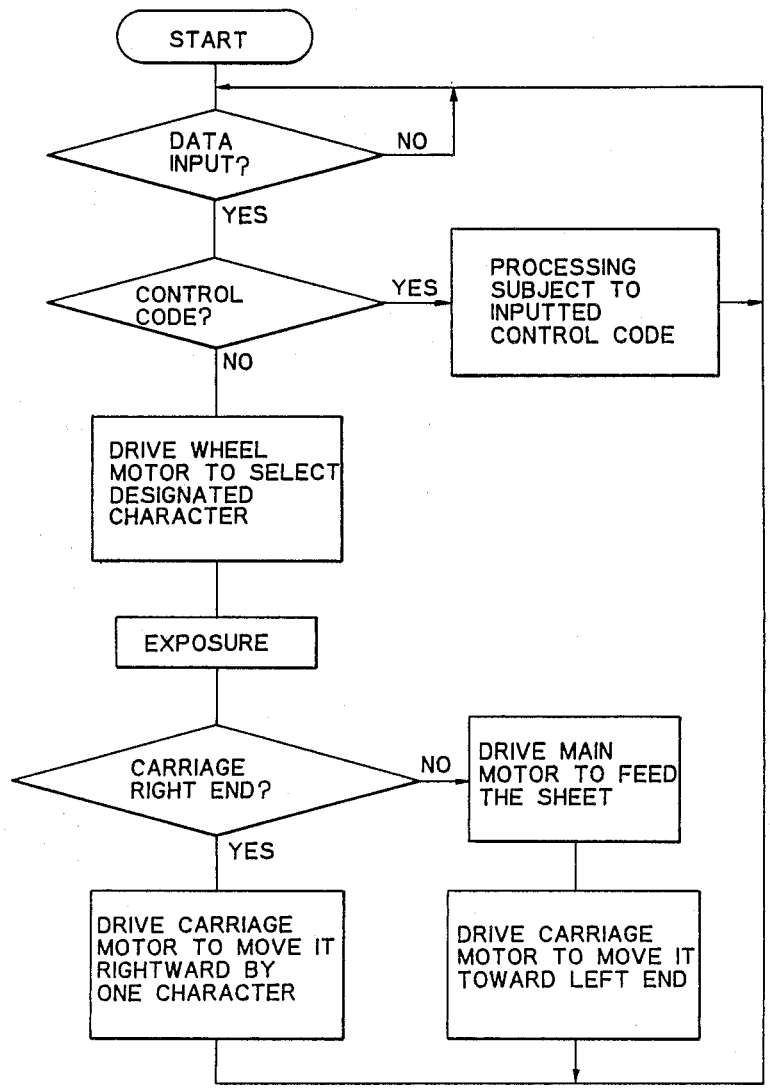
FIG. 1C is a flow chart of a program executed by the control unit illustrated in FIG. 1B.

The control program executed by the CPU 1001 is principally as illustrated in FIG. 1C which shows a flow chart of the program having stored in the ROM 1003.

In FIG. 1C, the CPU 1001 first accesses whether the character data or the control code data is inputted from the host computer 1005 and, upon confirming the input of the data, the inputted data is written into the RAM 1002 and the program advances to the next step.

At the next step, it is judged whether the inputted data is the character data or the control code data. In case the inputted data is the control code data, the processing subject to the inputted data, for instance, positioning of the carriage 18 at its initial position, is executed and then the program returns to its first step. On the other hand, in case the inputted data is the character data, the program advances to the step where the wheel motor 32 is driven through the wheel drive circuit 1007 so that the designated character pattern of the transparent font wheel 30 is positioned to face the lamp 34. At the subsequent step, the lamp 34 is turned on to expose the designated character pattern onto the recording sheet 10.

Successively, the CPU 1001 judges whether the carriage 18 is at its predetermined terminal position being set at right side in FIG. 1A. If the judgement is affirmative, the CPU 1001 drives the carriage motor 22 through the carriage drive circuit 1006 to shift the carriage 18 to the next printing position and then the program returns to its first step.

In case, the judgement is negative, i.e., the carriage 18 reaches to its predetermined terminal position, the CPU 1001 drives the main motor 1010 through the main drive circuit 1009 to upwardly feed the recording sheet 10 by one line in FIG. 1A and then drives the carriage motor 22 to return the carriage 18 to tis predetermined initial position set at the left side in FIG. 1A. Thereafter, the program returns to its first step and repeats the above processes until the printing is completed.

Figure 3A:
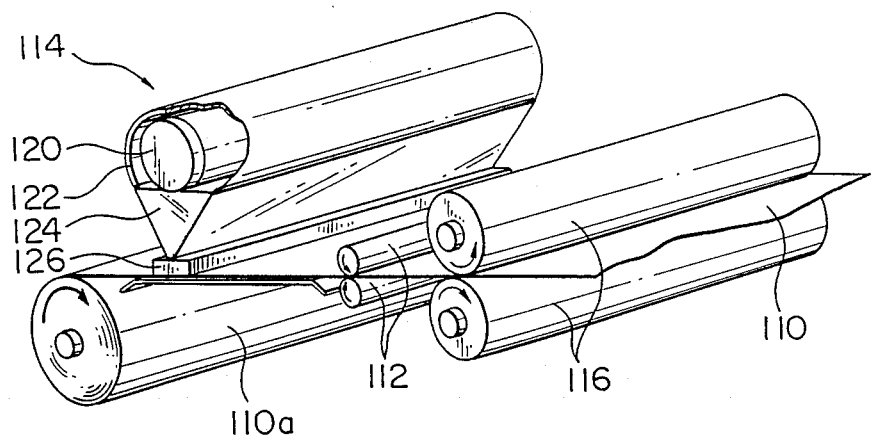
FIG. 3A is a perspective view showing principal parts of the photoprinter according to the second embodiment of the invention.

FIG. 3A shows principal parts of a photoprinter utilizing a liquid crystal shutter array 122.

In FIG. 3A, a photosensitive recording sheet 110 paid out from a roll 110a is sent toward right as viewed in FIG. 3A by a pair of pinch rollers 112. After being exposed to light by an exposing device 114, the recording sheet 110 is pressed by a pair of press rollers 116 to develope and fix the recorded image.

At the exposing device 114, ultraviolet ray emitted by a ultraviolet ray lamp 120 is concentrated as a straight line on the liquid crystal shutter array 126 by a reflection mirror 122 and a condensor prism 124. In response to a printing instruction, the liquid crystal shutter array 126 transmits or intercepts the ultraviolet ray along the straight line with predetermined small intervals. By performing a dot shaped exposure on the straight line while the photosensitive recording sheet 110 is being moved, exposure can be made in the form of a desired character or pattern.

Figure 3B:
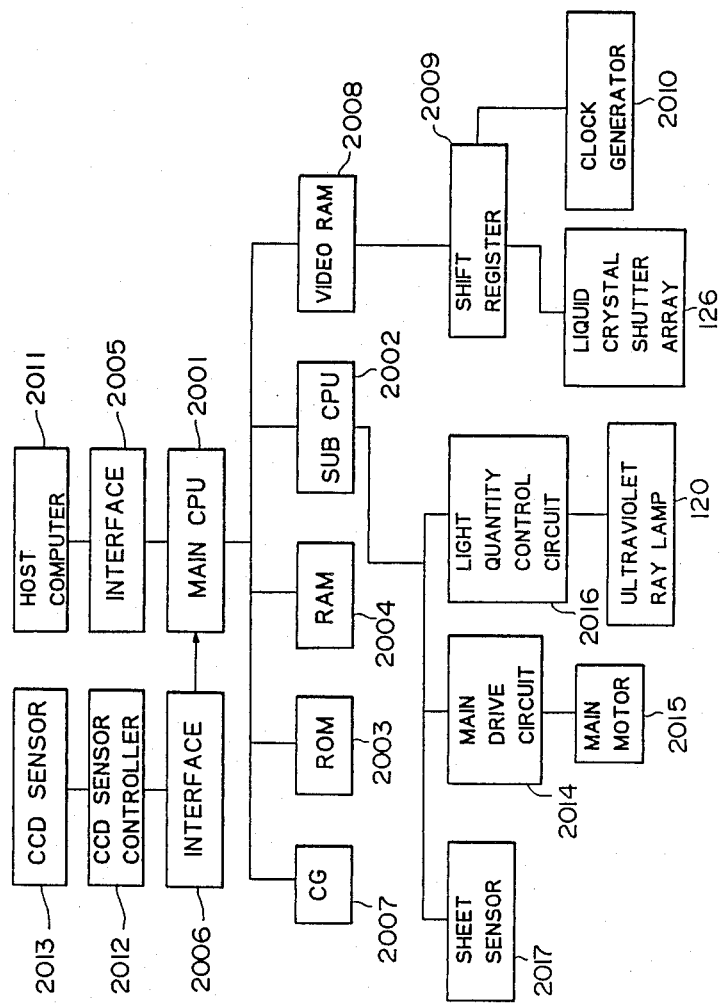
FIG. 3B is a block diagram showing a control unit of the photoprinter illustrated in FIG. 3A.

A control unit for operating the above described printer is constructed as shown in FIG. 3B.

The control unit of FIG. 3B principally comprises a main CPU 2001, a sub-CPU 2002, a ROM 2003 which serves as a data memory, Interfaces 2005 and 2006, a character generator 2007, a video RAM 2008, a shift register 2009 and a clock generator 2010.

The main CPU 2001 receives character data or image data (dot-decomposed data) page by page consecutively from a host computer 2011 through the Interface 2005. Further, the main CPU 2001 also receives, through a CCD sensor controler 2012 and the Interface 2006, binary-coded image data for one page from a CCD sensor 2013 which serves as an image reading sensor of an image scanner (not shown).

On the other hand, the sub-CPU 2002 controls each cell of the crystal liquid array 126 to turn on and off in accordance with the data stored in the video RAM 2008 by controlling the video RAM 2008, the shift rgister 2009 and the clock generator 2010. The sub-CPU 2002 also controls a main motor 2015 which regulates the revolution of the press rollers 116 through a main drive circuit 2014. Further, the ultra-violet ray lamp 120 is controlled to be turned on and off by the sub-CPU 2002 through a light quantity control circuit 2016.

A recording sheet sensor 2017 shown in FIG. 3B is substantially same as the recording sheet sensor 1011 of FIG. 1B.

The operation executed by the above control unit is hereinafter described in conjunction with FIGS. 3C and 3D.

Figure 3C:
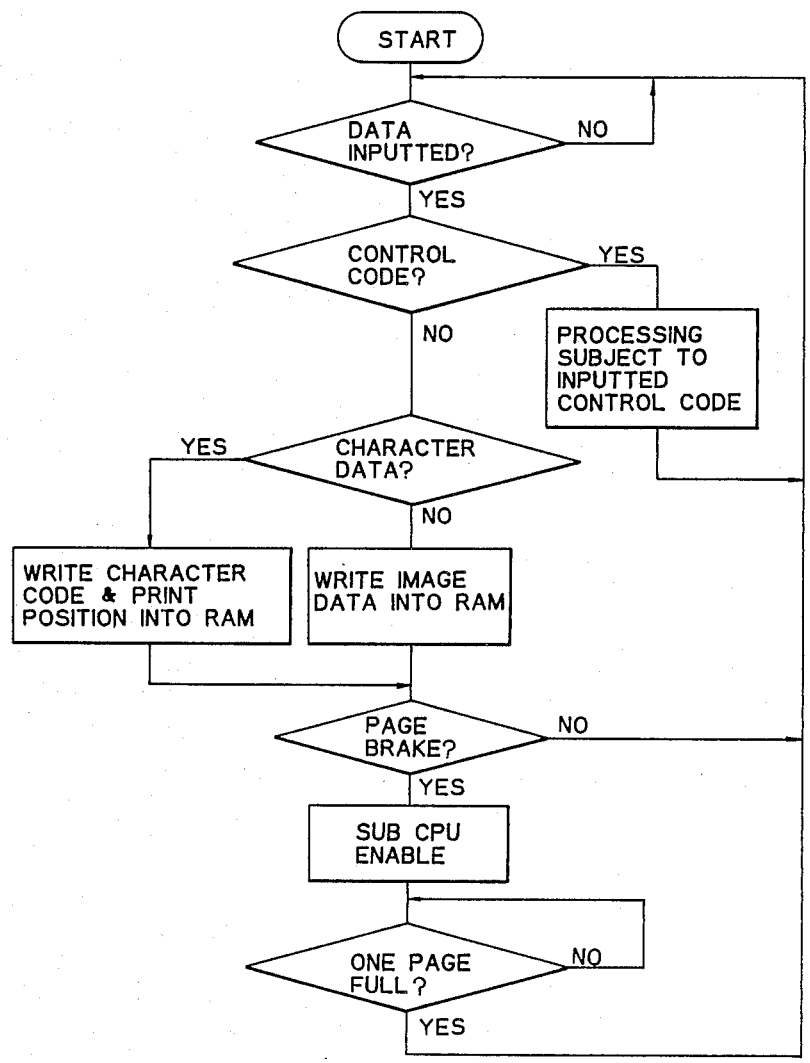
FIG. 3C is a flow chart of a program executed by the control unit illustrated in FIG. 3B.
Figure 3D:
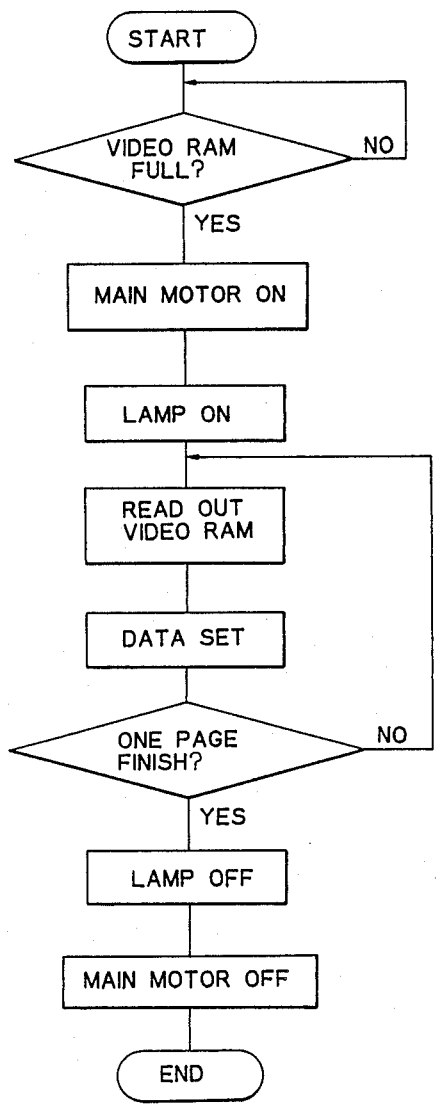
FIG. 3D is a flow chart of additional program executed by the control unit illustrated in FIG. 3B.

FIG. 3C is a flow chart showing a program executed by the main CPU 2001 while FIG. 3D is a flow chart showing a program executed by the sub-CPU 2002. These programs have been stored in the ROM 2003 of FIG. 3A.

The main CPU 2001 first accesses whether notice of input of character data or control code data is entered, and advances to the next step upon confirming the receipt of the notice of input.

At the next step, it is judged whether the inputted data is control code data, and in case the judgement is affirmative, after the inputted data is once written into the RAM 2004, the processing subject to the inputted control code data is executed and the program returns to its first step.

In case, the inputted data is character data or image data, the data is written into the video RAM 2008 as follows.

That is, in case the inputted data is character data, after the inputted data is once written into the RAM 2004, the main CPU 2001 accesses the character generator 2007 to retrieve the dot-decomposed pattern data corresponding to the inputted character data and write it into the video RAM 2008. In case the inputted data is image data, however, the inputted data is written into the video RAM 2007 as it is.

Thereafter, it is judged whether page break becomes necessary, and if unnecessary, the program returns to its first step for waiting next data input. When page break is judged to be necessary, the sub-CPU 2002 is enabled and after the sub-CPU 2002 has read out the data corresponding to one page from the video RAM 2007, the program returns to its first step.

In the meantime, in case binary-coded image data is inputted into the main CPU 2001 from the CCD sensor 2013 through the CCD sensor controller 2012 and the Interface 2006, the inputted image data is written into the video RAM 2008.

Thus, the main CPU 2001 controls processings for storing data into the video RAM 2008.

Now, the operation of the sub-CPU 2002 is explained with reference to FIG. 3D.

When the sub-CPU 2002 is enabled by the main CPU 2001, it is first checkes whether the data corresponding to one page have been written into the video RAM 2008, and if not, the sub-CPU 2002 waits until the data written into the video RAM 2008 reaches to the amount corresponding to one page.

Then, through a main drive circuit 2014 and a light quantity control circuit 2016, a main motor 2015 is driven and the ultraviolet lamp 120 is turned on. With these, the press rollers 116 commence to feed the recording sheet 110 and the exposure treatment thereto is prepared.

Thereafter, the sub-CPU 2002 accesses the video RAM 2008 at the next step to read out the first dot line data stored in the video RAM 2008 and set the read out dot line data into the shift register 2009 subject to the syncronizing signals generated by the clock generator 2010.

The liquid crystal shutter array 126 is fully turned off to intercept the light of the lamp 120 until the dot line data is delivered. Upon the delivery of the dot line data, each cell of the array 126 is turned on or remains to be off in accordance with the dot line data. Thus, the light of the lamp 120 is selectively projected onto the recording sheet 110 to form the dot line image thereon.

The sub-CPU 2002 then checks whether the data corresponding to one page has been read out from the video RAM 2008, and if not, the program returns to the step to read out the data from the video RAM 2008 to repeat the above processings.

When exposure treatment for one page has been finished, the image has been recorded on one page of the recording sheet 110. The program then advances to the steps to turn off the lamp 120 and to cease the revolution of the main motor 2013, and then the processing by the sub CPU 2002 is once terminated.

Figure 4A:
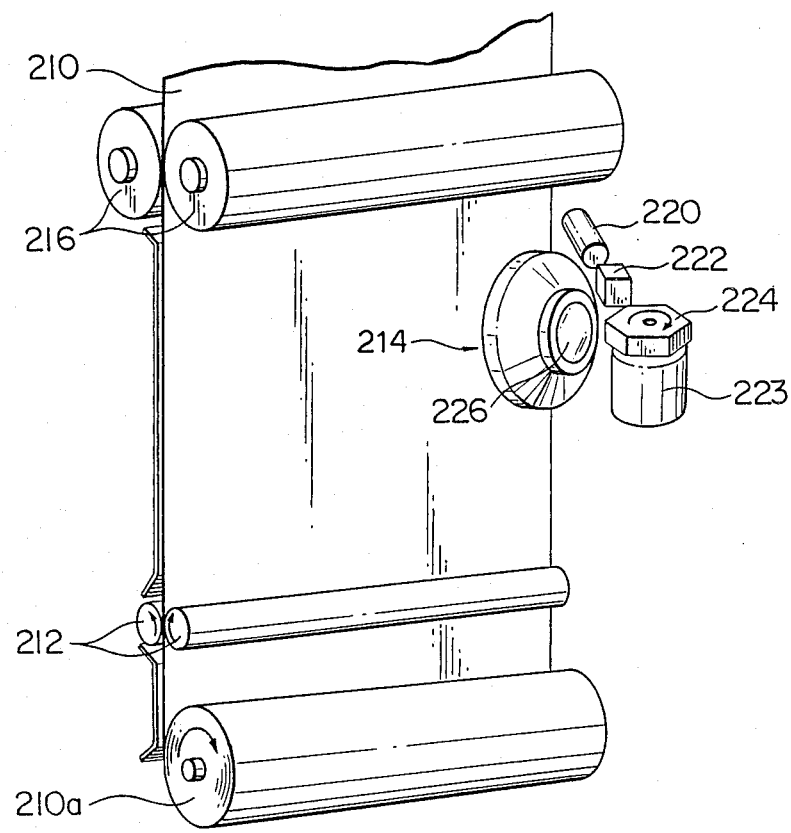
FIG. 4A is a perspective view of a laser printer according to a third embodiment of the invention.

A laser beam printer shown in FIG. 4A is the third embodiment of this invention. In this printer, a photosensitive recording sheet 210 paid out from a roll 210a is sent upwardly as viewed in FIG. 4A by a pair of feed rollers 212. After exposed to light by an exposing device 214, the recording sheet 210 is pressed by a pair of press rollers 216 located on the upper side to develope and fix the recorded image.

At the exposing device 214, laser beam emitted by a laser beam source 220 is modulated by an acoustic optical modulator 222 in accordance with a control signal and then scanned in the transverse direction of the recording sheet 210 by a polygonal mirror 224 driven by a scanner motor 223. The variation on the optical path length is compensated for by a f lens 226 by adjusting the focal length thereof whereby the recording sheet 210 is exposed to light in the desired form of characters and/or patterns. The development and fixing of the exposed recording sheet are performed in the same manner as in the first embodiment.

Although in the foregoing embodiments the photosensitive recording sheet optically printed with characters or patterns is applied with mechanical pressure by press rollers so as to rupture the microcapsules. Alternatively the microcapsules can be ruptured by thermal, electrical, physical and chemical means. For example, a substance that swells or expands due to heat can be enveloped in the microcapsules or they can be broken by electric discharge. Furthermore the shells of the microcapsules can be made of a substance that can be dissolved by physical or chemical means.

A control unit for operating the above laser printer is explained hereinafter in connectiion with FIG. 4B.

Figure 4B:
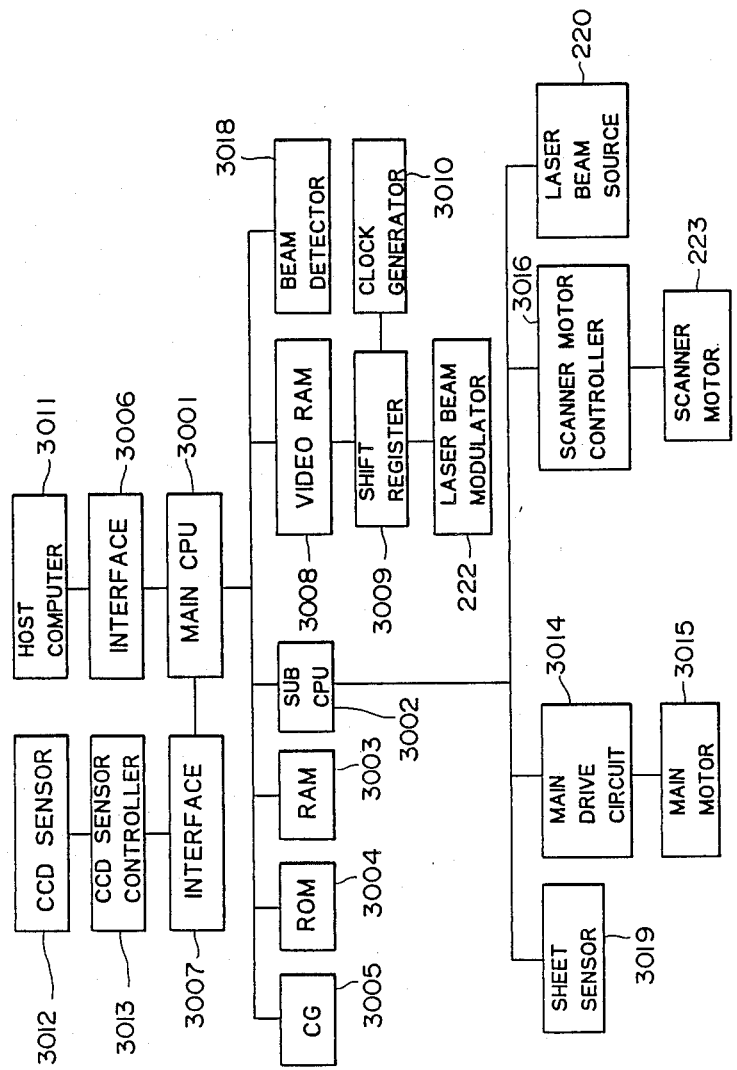
FIG. 4B is a block diagram showing a control unit of the laser printer illustrated in FIG. 4A.

In FIG. 4B, the control system principally comprises, similarly as the system shown in FIG. 3B, a main CPU 3001, a sub CPU 3002, a RAM 3003, a ROM 3004, a character generator 3005, Interfaces 3006 and 3007, and a clock generator 3010.

Samely as the control unit of FIG. 3B, the main CPU 3001 receives the printing information from the host computer 3011, a CCD sensor 3012 and a CCD sensor controller 3013, through the Interfaces 3006 and 3007.

The sub CPU 3002 controls the video RAM 3008, the shift register 3009 and the clock generator 3010 so as to regulate an acoustic optical modulator 222. The sub CPU 3002 also controls, through a main drive circuit 3014, a main motor 3015 which drives the press rollers 216. The sub CPU 3002 further controls, through a scanner motor controller 3016, the scanner motor 223 which drives the polygonal mirror 229 while controls the laser beam source 220.

A beam detector 3018 shown in FIG. 4B is the sensor to determine the timing to start the writing on the recording sheet 210 with the laser beam every lateral scanning. The beam detector 3018 is arranged, as illustrated in FIG. 4A, at a position which is out of the passage of the recording sheet 210 and within the scanning area of the laser beam. A sheet sensor 3019 is same as employed in the aforementioned embodiments.

The operation of the above constructed control unit is hereinafter described in conjunction with FIGS. 3C, 4C and 4D.

A flow chart of a program executed by the main CPU 3001 is substantially same as illustrated in FIG. 3C. FIGS. 4C and 4D are flow charts of programs executed by the sub CPU 3002. These programs have been stored in the ROM 3004 shown in FIG. 4B.

Figure 4C:
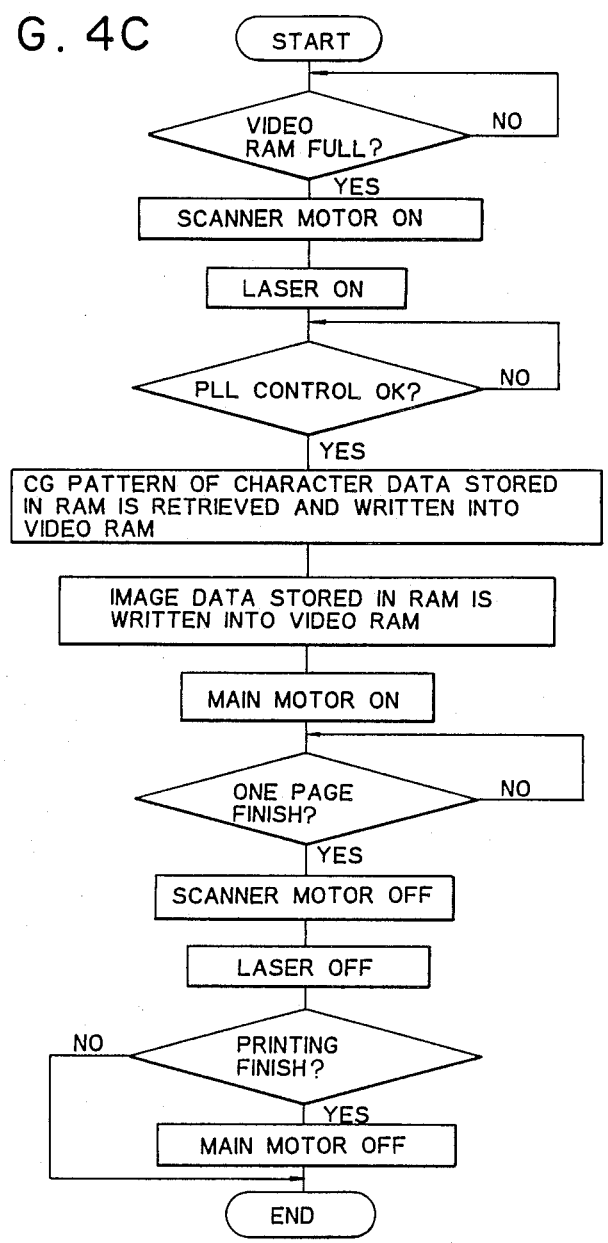
FIG. 4C and 4D are flow charts of additional program executed by the control unit illustrated in FIG. 4B.

The operation of the sub-CPU 3002 is as illustrated in FIG. 4C. That is, when the sub CPU 3002 is enabled by the main CPU 3001, the sub CPU 3002 first checks whether the data corresponding to one page has been read out from the video RAM 3008, and if not, the sub CPU 3002 waits until the data corresponding to one page is written into the video RAM 3008.

When the data corresponding to one page is written into the video RAM 3008, the sub CPU 3002 then starts the driving of the scanner motor 223 as well as the laser beam source 220. Thereafter, the sub CPU 3002 checks whether the scanner motor 223 reaches to and is stabled at the predetermined number of revolutions due to Phase Locked Loop (PLC) control executed by a scanner motor controller 3016. If not, the sub CPU 3002 waits until the scanner motor 223 is stabled at the predetermined number of revolutions, and then the program advances to the next step.

At the subsequent step, the sub CPU 3002 accesses the RAM 3003. In case the character data is stored in the RAM 3003, a dot pattern corresponding to the character data is retrieved in the character generator 3005 and stored into the video RAM 3008. On the other hand, in case the image data is stored in the RAM 3003, the data is written into the video RAM 3003 as it is.

At the next step, the sub CPU 3002 drives a main motor 3015 through a main drive circuit 3014 to upwardly feed the recording sheet 210 in FIG. 4A.

As the sub CPU 3002 drives the scanner motor 2233 and the laser beam source 220, the laser beam repeatedly scans the recording sheet 210 with being reflected by the polygonal mirror 224. The laser beam is periodically detected by the beam detector 3018 and the syncronizing signal outputted from the detector 3018 is fed to the sub CPU 3002 as an interrupt signal to periodically interrupt the program of FIG. 4C being executed by the sub CPU 3002.

Figure 4D:
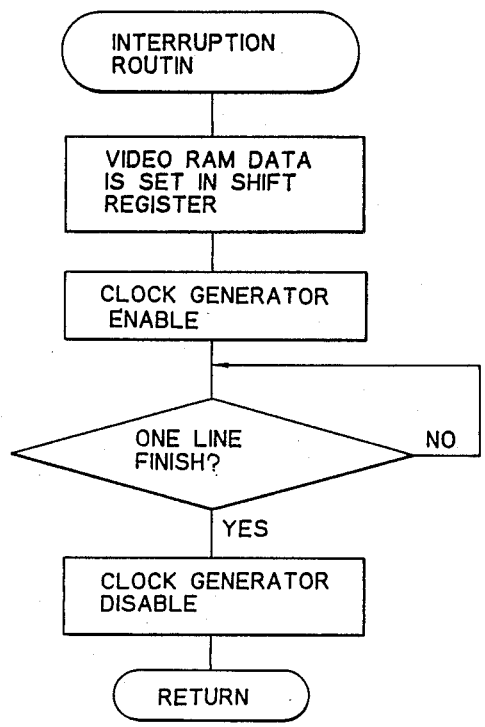

Upon interruption, as shown in FIG. 4D, the sub CPU 3002 sets dot line data for one line into the shift register 3009 from the video RAM 3008 while enables the clock generator 3009. The dot data serially outputted from the shift register 3009 in syncronization with clock signals generated by the clock generator 3009 is fed to a switching ciucuit (not shown) for the acoustic optical modulator 222. Thereby, the laser beam source 220 is ON-OFF modulated by the acoustic optical modulator 222 so as to record dot images on the recording sheet 210 by the modulated laser beam.

Then, the sub CPU 3002 checks whether scannings for one line are completed. After completion, the sub CPU 3002 disables the clock generator 3009 and returns to the program of FIG. 4C.

The sub CPU 3002 then turns on the main motor 3015 and checks whether printing for one page on the recording sheet 210 is completed. If not, the sub CPU 3002 waits until printing for one page is completed. During this waiting, the program of FIG. 4C is repeatedly interrupted and the above interrupt routine of FIG. 4D is each time executed.

Upon completion of one page printing, the sub CPU 3002 turns off the scanner motor 223 and the laser beam source 220 and checks whether printing is entirely completed. If completed, the sub CPU 3002 turns off the main motor 3015 and the program is ended. On the other hand, if the printing is not entirely completed, the processing is once terminated while remaining the main motor 3015 turned on, and the sub CPU 3002 waits to be again enabled by the main CPU 3001.

FIG. 5A shows principal parts of an optical color printer in which elements corresponding to those shown in FIG. 6 are designated by the same reference numerals. In this printer, a special photo and pressure sensitive sheet 313 is used as a recording paper in which three kinds of microcapsules respectively containing cyan dye precursor, a magenta dye precursor, and a yellow dye precursor, are mixedly and uniformly coated on a sheet or paper. More particularly, the cyan, magenta and yellow microcapsules contain therein photo-curable resins having different photosensitive wavelength regions, respectively. With the recording sheet of this type by irradiating the microcapsules with lights having wavelengths sensed by cyan, magenta and yellow microcapsules respectively, corresponding microcapsules are hardened. Thereafter, when the sheet is passed between press rollers 320 to rupture unhardened microcapsules the dye precursors such as cyan etc. reacts with the color developing material to develop desired colors.

Assume now that the spectrum sensitivity characteristic of the photo and pressure sensitive sheet has a peak sensitivity for cyan color at a wavelength of 650 mm, a peak sensitivity for magenta color at a wavelength of 550 mm, and a peak sensitivity for yellow color at a wavelength of 400 mm, the laser beam oscillator is constituted by a cyan oscillator 314 producing cyan light having a wavelength of 650 mm sensible by the cyan microcapsules, a magenta oscillator 315 producing magenta light having a wavelength of 550 mm sensible by the magenta microcapsules and a yellow oscillator 316 producing yellow light sensible by the yellow microcapsules.

The beams emitted by respective oscillators 314, 315 and 316 are gathered together, as illustrated in FIG. 5B, through total reflection mirror 317 and half mirrors 318, and then projected upon a polygonal scanning mirror 303 through a condenser lens 319. The laser beam reflected by the scanning mirror 303 is used to directly scan the photo and pressure sensitive sheet 313 through f0 lens 305. After irradiation, the sheet 313 is passed between press rollers 320.

To produce a color print by using the photoprinter described above, oscillators 314, 315 and 316 are ON/OFF controlled by printing or picture image informations issued by a later described control unit contained in the printer. For example, where only the cyan oscillator 314 is turned ON while magenta and yellow oscillator 315 and 316 are turned OFF, only the cyan microcapsules are hardened. As a consequence, magenta and yellow microcapsules are ruptured by the press rollers 320 whereby the dye precursors contained in the crushed microcapsules react with the color developing material to develop red color corresponding to a mixture of magenta and yellow colors.

In the same manner, when only the magenta oscillator 315 is turned ON while cyan and yellow oscillators 314 and 316 are turned OFF, the cyan and yellow microcapsules are ruptured by press rollers 320, thereby developing green color. Furthermore, when only the yellow oscillator 316 is turned ON while cyan and magenta oscillators 314 and 315 are turned OFF, blue color is developed. When cyan and magenta oscillators 314 and 315 are turned ON while the yellow oscillator 316 is turned OFF, only the yellow microcapsules are ruptured so that yellow color is developed. In the same manner, cyan or magenta color can be developed. When cyan, magenta and yellow oscillators 314, 315 and 316 are all turned ON, since no microcapsule is ruptured, the photo and pressure sensitive sheet remains white. On the other hand, when cyan, magenta and yellow oscillators 314, 315 and 316 are turned OFF, all microcapsules are ruptured thereby developing black color, that is a mixture of three primary colors.

A control unit for operating the above printer is hereinafter described with reference to FIG. 5C.

The control system of FIG. 5C is fundamentally same as the control unit of FIG. 4B, except that the control unit of FIG. 5C is constructed to be used for a multicolor printer. That is, the control unit of FIG. 5C employs three groups consisting of a video RAM, a shift register and a clock generator, for three primary colors, i.e., magenta, cyan and yellow.

The programs executed by a main CPU and a sub CPU are, as illustrated in FIGS. 5D, 5E and 5F, also fundamentally same as those of FIGS. 4C, 4D, and 4E, except that, in the program of FIG. 5D, the character data or the image data is decomposed into three primary color data and each color decomposed data is written into the corresponding video RAM.

FIG. 7A shows principal parts of yet other embodiment of this invention in which either one of the light reflected by a manuscript or light transmitting through a photograph film, and light controlled in accordance with a character or pattern image information is selectively projected on the photo and pressure sensitive recording sheet.

In this embodiment, light emitted by an exposure lamp 402 and reflected by a manuscript 401 seated on a transparent tray 417 is projected on the photo and pressure sensitive recording sheet 415 through reflecting mirrors 403, 405 and a condenser lens 404. Instead of the light reflected by the manuscript 401, laser beam generated by a laser oscillator 413 and controlled by a character or a picture image information is projected on the photo and pressure sensitive recording sheet 415 through a rotary mirror 414, thereby increasing the versatility of the photoprinter.

The embodiment shown in FIG. 8 is different from that shown in FIG. 7A in that the photo and pressure sensitive recording sheet 415a is coated with microcapsules while a separate developing sheet 417 coated with the color developing material are simultaneously passed through press rollers 416 so as to cause the dye precursors in the crushed microcapsules to react with the color developing material on the developing sheet 417 to form a color picture image.

A control unit for the above embodiments can be, for instance, constructed as illustrated in FIG. 9.

In FIG. 7B, the control unit principally comprises a CPU 5001, a RAM 5002, a ROM 5003 and an Interface 5004.

The CPU 5001 controls, through the Interface 5004 and drivers 5005-5008, a tray clutch 5009, a sheet feed clutch 5010, the exposure lamp 402 and a main motor 5011. The tray clutch 5009 regulates the movement of the tray 417 on which the manuscript 401 is seated. The sheet feed clutch 5010 regulates the revolution of the press rollers 416. The main motor 5011 serves as a driving source for the press rollers 416, the tray 417 and so on.

Into the CPU 5001, inputted are the operation signals from panel switchs (a switch for print-start, a switch for setting number of pieces to be printed, and so on) 5012, and the detection signals from a tray sensor 5013 and a sheet sensor 5014. The tray sensor 5013 detects the position of the tray 417, and the sheet sensor 5014 detects the exhaustion of the recording sheets.

The operation of the control unit as above constructed is hereinafter explained in conjunction with FIG. 7C.

The CPU 5001 first checks whether a copy mode is selected by the panel switch 5012 when the print-start button (not shown) on the panel switch 5012 is turned on.

In case a copy mode is selected, the CPU 5001 first turns on the main motor 5011 and the tray clutch 5009, thereby the tray 417 starts to move in the direction of the arrows shown in FIGS. 7A and 8.

The CPU 5001 then checks whether the tray 417 reaches to its predetermined initial position by accessing the detecting signals from the tray sensor 5013. When the tray 417 has reached to its predetermined initial position, the CPU 5001 turns on the exposure lamp 402 and the sheet feed clutch 5010 to feed the recording sheets 515, and reverses the direction of the movement of the tray 417 to expose themanuscript 401 until the tray 417 reaches to its predetermined terminal position.

The CPU 5001 then checks whether the set number of copies have been completed, and if not, the above steps are repeated. Upon the completion of the set number of copies, the tray clutch 5009 is turned off and the program returns to its first step.

Thus, the image on the manuscript 401 is copied on the recording sheet 415, 415a.

On the other hand, in case a printer mode is selected, although not minutely illustrated in FIG. 7C, the processings substantially same as those described with reference to FIG. 4B are executed.

What is claimed is:

1. An optical printing system for printing an image on a recording sheet, the improvement which comprises in that said recording sheet is coated with microcapsules on one surface thereof, each said microcapsule enveloping a first component which changes color when reacts with second component, said microcapsule further enveloping a third component which varies the mechanical strength of microcapsule when light is projected thereto;

that said printing is carried out by means for selectively exposing a light against said one surface of the recording sheet in accordance with an image to be printed on said recording sheet, and means for rupturing the microcapsules whose mechanical strength is low; and that said optical printing system includes control means for carrying out said printing in accordance with a predetermined sequence.

2. The optical printing system according to claim 1 wherein said first component is a dye precursor, said second component is a color developer, and said third component is a photo-softenable resin.

3. The optical printing system according to claim 1 wherein said first component is a dye precursor, said second component is a color developer, and said third component is a photo-curable resin.

4. The optical printing system according to claim 1 wherein said microcapsules are coated on a layer of said second component on said recording sheet.

5. The optical printing system according to claim 1 wherein said first component is a decolorizing agent while said second component is a dye which colors said one surface of the recording sheet.

6. The optical printing system according to claim 1 wherein said microcapsule further envelopes a substance swelled by heat.

7. The optical printing system according to claim 1 wherein shells of said microcapsule are made of a meltable substance.

8. The optical printing system according to claim 1 wherein said exposure means comprises a belt driven in a direction perpendicular to a direction of movement of said recording sheet, a carriage secured to said endless belt, a printing type wheel carried by said carriage, said printing type wheel is provided with a transparent printing type font about a periphery of said wheel, and an exposure lamp carried by said carriage for projecting light through a selected one character of said transparent printing type font against said recording sheet.

9. The optical printing system according to claim 8 which further comprises belt drive means for reciprocally driving said endless belt, wheel drive means for rotating said printing type wheel, switch means for turning on and off said exposure lamp, and sheet feed means for transferring said recording sheet.

10. The optical printing system according to claim 9 which further comprises print instruction means for feeding a printing information to said control means; and wherein said control means controls, responsive to said printing information, said wheel drive means for positioning said selected one pattern to a position facing said exposure lamp, and said exposure lamp to expose said selected one pattern onto the recording sheet.

11. The optical printing system according to claim 10 which further comprises carriage detect means for detecting the position of said carriage, and wherein said control means further controls said belt drive means for moving said carriage to a next printing position every after said exposure is completed, and for returning said carriage to its predetermined initial position when said carriage detect means detects that said carriage is at its predetermined terminal position.

12. The optical printing system according to claim 11 wherein said contorl means further controls said sheet feed means for advancing said recording sheet by a predetermined amount when said carriage returns to its initial position.

13. The optical printing system according to claim 1 wherein said exposure means comprises a light source, a liquid crystal shutter array disposed on said recording sheet, and means for concentrating the light on said liquid crystal shutter array as a straight line.

14. The optical printing system according to claim 13 which further comprises switch means for turning on and off said light source, sheet feed means for transferring said recording sheet and print instruction means for feeding a printing information to said control means.

15. The optical printing system according to claim 14 wherein said control means controls, responsive to said printing information, said switch means and said liquid crystal shutter array to transmit or intercept the light of said light source with minute intervals while controls said sheet feed means for transferring said recording sheet at a predetermined speed, thus providing a dot-shaped exposure along said straight line.

16. The optical printing system according to claim 1 wherein said exposure means comprises a laser beam source, modulating means for modulating laser beam emitted by said laser beam source, and deflecting means for scanning said modulated laser beam across said recording sheet.

17. The optical printing system according to claim 16 which further comprises switch means for turning on and off said laser beam source, sheet feed means for transferring said recording sheet and print instruction means for feeding a printing information to said control means.

18. The optical printing system according to claim 17 wherein said control means controls, responsive to said printing information, said switch means, said modulating means and said deflecting means to scan the laser beam modulated in accordance with said printing information across said recording sheet, while controls said sheet feed means for transferring said recording sheet at a predtermined speed.

19. The optical printing system according to claim 16 wherein said deflecting means comprises a polygonal rotary mirror.

20. The optical printing system according to claim 19 wherein f lens is utilized for compensating for variation in a length of an optical path.

21. An optical printing system for printing an image on a recording sheet, the improvement which comprises in
that said recording sheet comprises a supporting sheet and a plurality of photosensitive microcapsules being uniformly coated on one surface of said supporting sheet, the mechanical strength of said photosensitive microcapsules being varied when exposed to light, said microcrocapsules comprising cyan microcapsules each containing a cyan dye precursor and a first photosensitive resin, magenta microcapsules each containing a magenta dye precursor and a second photosensitive resin, and yellow microcapsules each containing a yellow dye precursor and a third photosensitive resin, said first, second and third photosensitive resins being sensitive to lights of different wave length respectively;
that said printing is carried out by means for exposing lights of wavelength regions sensible by said respective microcapsules said one surface of the recording sheet, and means for rupturing the microcapsules whose mechanical strength is low; and
that said optical printing system includes control means for carrying out said printing in accordance with a predetermined sequence.

22. The optical printing system according to claim 21 wherein said exposure means comprises three laser oscillator respectively emitting laser beams having wavelengths sensible by said respective microcapsules, and deflecting means for scanning said laser beams across said recording sheet.

23. The optical printing system according to claim 22 wherein said laser beams emitted by said three laser oscillator are combined into a single beam by optical means, and said recording sheet is scanned with said single beam.

24. The optical printing system according to claim 22 which further comprises sheet feed means for transferring said recording sheet, and print instruction means for feeding a printing information to said control means.

25. The optical printing system according to claim 24 wherein said control means controls, responsive to said printing information, said laser oscillators and said deflecting means to scan the laser beams emitted in accordance with said printing information across said recording sheet, while controls said sheet feed means for transferring said recording sheet at a predtermined speed.

26. The optical printing system according to claim 1 wherein said exposure means comprises a first exposure means and a second exposure means, and said optical printing system includes select means for selecting which one of said first and second exposure means is utilized to expose said recording sheet.

27. The optical printing system according to claim 26 wherein said first exposure means comprises a light source for projecting a light against a subject to be copied to form an optical image corresponding to said subject to be copied, and converge means for converging said optical image onto said one surface of said recording sheet.

28. The optical printing system according to claim 27 wherein said second exposure means comprises a laser oscillator and deflecting means for deflecting a laser beam emitted by said laser oscillator across said on e surface of said recording sheet.

29. The optical printing system according to claim 27 which further comprises switch means for turning on and off said light source and sheet feed means for transferring said recording sheet; and wherein said control means controls, if said first exposure means is selected by said select means, said switch means for forming said optical image so that said recording sheet is exposed to said optical image, while controls said sheet feed means for transferring said recording sheet at a predtermined speed.

30. The optical printing system according to claim 28 which further comprises sheet feed means for transferring said recording sheet and print instruction means for feeding a printing information to said control means; and wherein said control means controls, responsive to said printing information, said laser oscillator and said deflecting means to scan the laser beam emitted in accordance with said printing information across said recording sheet, while controls said sheet feed means for transferring said recording sheet at a predtermined speed.

* * * * *